(12) United States Patent
Narayan et al.

(10) Patent No.: US 8,676,546 B2
(45) Date of Patent: Mar. 18, 2014

(54) GRADING METHOD UTILIZING FLOW GRADE SOLUTION

(75) Inventors: Smita Narayan, Manchester, NH (US); Christopher E. Putnam, Manchester, NH (US)

(73) Assignee: Autodesk, Inc., San Rafael, CA (US)

( * ) Notice: Subject to any disclaimer, the term of this patent is extended or adjusted under 35 U.S.C. 154(b) by 80 days.

(21) Appl. No.: 13/178,349

(22) Filed: Jul. 7, 2011

(65) Prior Publication Data

US 2013/0013263 A1 Jan. 10, 2013

(51) Int. Cl.
*G06F 17/50* (2006.01)

(52) U.S. Cl.
USPC ............................................................ 703/1

(58) Field of Classification Search
USPC ............................................................ 703/1
See application file for complete search history.

(56) References Cited

U.S. PATENT DOCUMENTS

| | | | |
|---|---|---|---|
| 5,329,464 A | 7/1994 | Sumic et al. | |
| 5,553,211 A | 9/1996 | Uotani | |
| 6,496,814 B1 | 12/2002 | Busche | |
| 6,732,120 B1 | 5/2004 | Du | |
| 6,768,928 B1 | 7/2004 | Nagasawa et al. | |
| 6,912,692 B1 | 6/2005 | Pappas | |
| 7,130,774 B2 | 10/2006 | Thomas et al. | |
| 7,164,883 B2 | 1/2007 | Rappaport et al. | |
| 7,523,396 B2 | 4/2009 | Lewis et al. | |
| 7,617,077 B2 | 11/2009 | Putnam et al. | |
| 7,634,149 B2 | 12/2009 | Putnam et al. | |
| 7,965,902 B1 | 6/2011 | Zelinka et al. | |
| 8,051,087 B2 | 11/2011 | Campbell et al. | |
| 8,171,424 B1 | 5/2012 | Karam | |
| 8,346,016 B1 | 1/2013 | Zelinka et al. | |
| 8,457,441 B2 | 6/2013 | Joy | |
| 8,494,255 B2 | 7/2013 | Caduff | |
| 8,538,676 B2 | 9/2013 | Wuersch et al. | |
| 2001/0049704 A1 | 12/2001 | Hamburg et al. | |
| 2004/0004611 A1 | 1/2004 | Komornicki et al. | |
| 2004/0076279 A1 | 4/2004 | Taschereau | |
| 2005/0034075 A1 | 2/2005 | Riegelman et al. | |
| 2005/0068315 A1 | 3/2005 | Lewis et al. | |
| 2005/0104884 A1 | 5/2005 | Iwata et al. | |
| 2008/0183434 A1* | 7/2008 | Putnam et al. | 703/1 |
| 2013/0007575 A1 | 1/2013 | Bacus et al. | |

OTHER PUBLICATIONS

Autodesk, AutoCAD Civil 3D 2010 User Documentation, retrieved Mar. 12, 2013.*

(Continued)

*Primary Examiner* — Kandasamy Thangavelu
*Assistant Examiner* — Michael P Healey
(74) *Attorney, Agent, or Firm* — Gates & Cooper LLP

(57) ABSTRACT

A method, apparatus, and article of manufacture provide the ability to create a flow-grade solution. In a computer application, a curve from which a slope is to be projected and an elevation field depth buffer, that provides a 2D array with one element for each coordinate, are defined. A slope angle for the slope is specified. As grading shapes are rendered, by sweeping a cone with the slope angle along the curve, a grid is used to capture, into the buffer, an elevation for each vertex of the grid. A flow grade solution represented by the field depth buffer is thus obtained. The flow grade solution includes a path of steepest slope (determined from the elevations stored in the buffer) from any given location in the grid.

24 Claims, 4 Drawing Sheets

(56) References Cited

OTHER PUBLICATIONS

ESRI, Hydrologic Analysis, ArcGIS Desktop Help 9.1, latest update: Mar. 26, 2007, retrieved: Mar. 13, 2013.*

Schor et al., Landforming: An Environmental Approach to Hillside Development, Mine Reclamation and Watershed Restoration, Copyright 2007, John Wiley & Sons, Inc., pp. 179,184.*

Brown et al., Gradients and Vector fields, Department of Mathematics, Statistics and Computer Science University of Illinois at Chicago, http://www.math.uic.edu/coursepages/math210/labpages/lab5, retrieved: Mar. 13, 2013, (1999).*

Moore et al., Digital Terrain Modelling: A Review of Hydrological, Geomorphological, and Biological Applications, Hydrological Processes, vol. 5, 3-30 (1991).*

Autodesk Reference Date Information, Created Apr. 8, 2013, Indicates online availability dates of Apr. 20, 2010 (p. 1), Apr. 20, 2009 (p. 2), and May 27, 2007 (pp. 3-8) for "Autodesk, AutoCAD Civil 3D 2010 User Documentation, retrieved Mar. 12, 2013" reference submitted with first office action.*

Autodesk, AutoCAD Civil 3D 2010 Best Practices, Apr. 2009, Autodesk Inc., pp. 129,132,133,137-156.*

D. Giordan, S. Moniz, "Using Adobe Photoshop 5" pp. 1-17, 2007.

Autodesk Design Review, Getting Started Guide, pp. 1-56, 2007.

* cited by examiner

GRADING METHOD UTILIZING FLOW GRADE SOLUTION

CROSS-REFERENCE TO RELATED APPLICATIONS

This application is related to the following co-pending and commonly-assigned patent applications, which applications are incorporated by reference herein:

U.S. patent application Ser. No. 13/178,353, entitled "INTERACTIVELY SHAPING TERRAIN THROUGH COMPOSABLE OPERATIONS", by Smita Narayan and Christopher E. Putnam, et. al., filed on Jul. 7, 2011; and U.S. patent application Ser. No. 13/178,358, entitled "DIRECT MANIPULATION OF COMPOSITE TERRAIN OBJECTS WITH INTUITIVE USER INTERACTION", by Smita Narayan and Christopher E. Putnam, et. al., filed on Jul. 7, 2011.

BACKGROUND OF THE INVENTION

1. Field of the Invention

The present invention relates generally to computer aided design (CAD) applications, and in particular, to a method, apparatus, and article of manufacture for interactively shaping a terrain using a flow grade solution in a building information model (BIM) of a CAD.

2. Description of the Related Art

Grading is configuring the land's surface by removing or adding soil and other earthen material to artificially shape the land to best suit a project. The grading of a site serves three basic purposes: functional, drainage, and aesthetic. These basic purposes often conflict with each other and prior art solutions fail to provide an easy mechanism to satisfy all of these purposes while utilizing a single grading model as the user proceeds from concept to completion of a project. Such problems may be better understood with a description of prior art grading and grading solutions.

Functionality: Terrain grading is used to re-form terrain/land in order to provide land that is functional or can be used for a functional purpose. In this regard, grading reforms the terrain to make it compatible for an intended land use. Such functional land uses may include parking lots, ponds, swales, and other features. To provide for such land use, terrain grading creates finish smooth slopes at specified grades.

Facilitate Drainage: Grading establishes and controls the new drainage pattern to direct the runoff to outfall points and away from buildings.

Aesthetic: A good design creates an aesthetically pleasing and appealing landscape. Natural landforms are created by using concave and convex shaped slopes rather than uniform gradient slopes. The creation of aesthetic landforms must be balanced by the cost of constructing them.

These goals often conflict with each other and to integrate them into the final design, they must be analyzed collectively. In practice, a grading plan is established through several successive trials of different schemes. This process can be very tedious. A grading scheme often involves projecting slopes from curves representing shoulder edges or water boundaries, and leveling them against the existing terrain. The implementation of this concept is fraught with difficulties due to a variety of complex scenarios that could not be handled by a naïve ray projection algorithm, especially when projecting from curves with rapid elevation changes.

More specifically, prior art products provide a grading scheme by projecting each segment of a curve at a given cross-slope to produce bounded panels, and then combining them. Such a methodology involves complex models whose history of operations is difficult to track. The complexity of the existing solution results in difficult software implementations that are error prone, unstable, and may completely fail (if supplied geometry is complicated). Accordingly, users are hesitant to use the prior art product on account of such stability problems. In addition, the existing grading solution does not provide a design based on maximum allowable grade, which may be dictated by soil quality, design standards, and/or ADA [American with Disabilities Act] guidelines. The prior art also provides few tools for modifying existing solutions in ways that directly map to site development needs. Further, the prior art fails to provide tools that can be used in a conceptual design that can also later be refined or used to generate production drawings. In this regard, it is desirable to provide a tool that can be used to obtain quick answers for early decision making (e.g., approximate values of earthwork quantities) that can be refined later to produce a more accurate solution.

As described above, a particular need is that of designing the terrain to facilitate drainage. The prior art provides a complex methodology that is neither natural nor user friendly. In this regard, the prior art measures the cross grade (or cross slope) perpendicular to the curve from which a slope is projected. Each segment of the curve is projected at a given cross-slope to produce bounded panels that are combined by intersecting them against each other. This approach involves complex algorithms to solve inside corners and the intersection of overlapping solutions. For example, the rapid transitions of offsets across the inside corners cause incomplete or failed 3D intersections of the adjacent, bounded planes. Likewise, a multi-elevation rounded corner projected beyond its radius produces equally complex intersection geometry. The intersections are solved by simplifying the geometry and integrating the solution into planar topology to remove redundant loops. However, stability problems and specialized functionality restrict the use of the prior art methods.

Thus, prior art solutions produce inside corners with complex geometry that is hard to clean, especially if the solutions involve degenerate partial solutions. Solving such inside corners involves complex algorithms and is a cumbersome process. In addition, when designing the drainage, the prior art fails to provide the ability to create or use organic shapes that could be used to produce an aesthetically pleasing landscape.

Moreover, there are few tools for modifying prior art solutions in ways that directly map to site development needs. Even though there is a large set of elevation/grade editing tools, the overlapping line work can create difficult to resolve stability problems and elevation conflicts. Predicting the impact of an edit to a solution requires experience, and factors like tessellation quality, crossing break lines, and Delaunay triangulation rules can confound a new user.

As described above, the existing solution does not allow the creation of a conceptual model that can later be refined into a more accurate model. In practice, before any detailed grading plans are underway, the designer needs to develop a generalized grading scheme to determine any problem areas and get a feel for the type of limitations the site may have as the design progresses. In the preliminary analysis, engineers are often looking for quick early-stage approximate answers (like road and parking area gradients, drainage patterns, rough estimates of cut and fill quantities, need for steep slopes, retaining walls, etc.) to make quick decisions that can later be refined into production drawings. The prior art fails to provide such capabilities.

In view of the above, it is desirable to enable a single set of tools that can be used from concept through completion, in the same environment, while allowing the user to design a grading solution in a natural and desirable manner.

SUMMARY OF THE INVENTION

One or more embodiments of the invention provide a grading method that provides a "flow-grade" solution. An elevation field depth buffer is computed to create an approximate geometry that represents the finished slope. Such a solution is different from a "cross-grade" solution of the prior art. The cross grade (or cross slope) is measured perpendicular to the curve from which the slope is projected. However, a flow grade is measured along the path of steepest descent. Designing by flow grade and direction is more natural and desirable for parking lot design, landfills, and excavation design as it allows the specification of steepest allowable grade (which may be based on design standards and/or soil quality) and directing drainage along the flow path.

In addition, flow grading produces clean inside corners and requires no special handling due to the way an elevation field depth buffer is defined (see detailed description below). Moreover, the design of embodiments of the invention allows clean overlapping of grading solutions from multiple curves, by combining the depth buffers produced from each curve. A flow-grade design of the present invention may also allow the creation of organic shapes (concave/convex) by sweeping a truncated cone with a tangent sphere. Further, a flow grade model allows the user to change a grid density to improve the quality of a model at the expense of time to update, thus empowering the user to transition from concept to completion, using the same grading model.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

Embodiments of the invention provide a grading method in the form of a "flow grade" solution that evaluates an approximate geometry of a projected slope using an elevation field depth buffer. The grading shapes are produced by sweeping a cone along the curve from which the slope is to be projected. A grid is used to capture the maximum or minimum elevation seen for each vertex as grading shapes are "rendered" to the buffer. The flow grade solution from any given point is a cone with its apex at that point extending at the desired grade to the extents of the grid. Hence, a cone is used to produce the flow grade geometry.

In addition, organic shapes may be created by truncating the cone and replacing the apex with a tangent sphere. Accumulating the values for many such cones along the footprint provides a good approximation to the "flow grade" solution. This process of generating the flow grade solution always produces clean inside corners even when the slope is projected from curves with complex geometry. Embodiments may also handle cross grading solutions gracefully. Simplicity of data access allows many opportunities for performance optimizations through adaptive refinement, multi-threading, and graphics processing unit (GPU) computing. For example, the entire site can be solved in parallel by creating a team of threads where each thread is responsible for solving a small set of grid vertices. Further, embodiments of the invention allow the user to change the grid density to improve the quality of the model at the expense of time to update, thus empowering the user to transition from concept to completion, all in the same environment.

Hardware Environment

Figure 1:
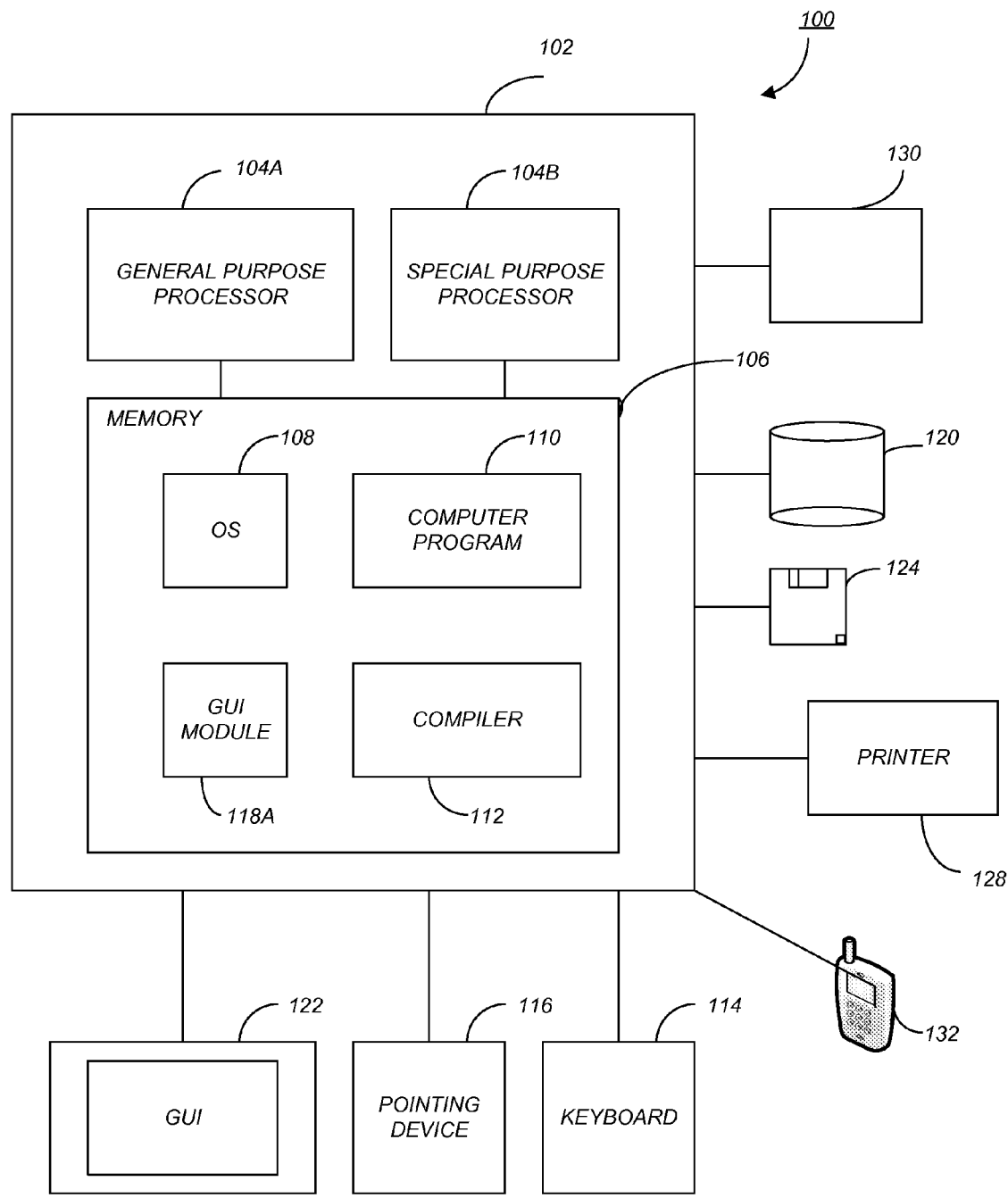
FIG. 1 is an exemplary hardware and software environment used to implement one or more embodiments of the invention.

FIG. 1 is an exemplary hardware and software environment 100 used to implement one or more embodiments of the invention. The hardware and software environment includes a computer 102 and may include peripherals. Computer 102 may be a user/client computer, server computer, or may be a database computer. The computer 102 comprises a general purpose hardware processor 104A and/or a special purpose hardware processor 104B (hereinafter alternatively collectively referred to as processor 104) and a memory 106, such as random access memory (RAM). The computer 102 may be coupled to other devices, including input/output (I/O) devices such as a keyboard 114, a cursor control device 116 (e.g., a mouse, a pointing device, pen and tablet, etc.) and a printer 128. In one or more embodiments, computer 102 may be coupled to or may comprise a thin client device. Such a thin client device may comprise a device with limited and/or full processing capabilities and is often portable/handheld and may include a media viewing/listening device 132 (e.g., an MP3 player, iPod™, Nook™, portable digital video player, cellular device, personal digital assistant, handheld computer, etc.).

In one embodiment, the computer 102 operates by the general purpose processor 104A performing instructions defined by the computer program 110 under control of an operating system 108. The computer program 110 and/or the operating system 108 may be stored in the memory 106 and may interface with the user and/or other devices to accept input and commands and, based on such input and commands and the instructions defined by the computer program 110 and operating system 108 to provide output and results.

Output/results may be presented on the display 122 or provided to another device for presentation or further processing or action. In one embodiment, the display 122 comprises a liquid crystal display (LCD) having a plurality of separately addressable liquid crystals. Each liquid crystal of the display 122 changes to an opaque or translucent state to form a part of the image on the display in response to the data or information generated by the processor 104 from the application of the instructions of the computer program 110 and/or operating system 108 to the input and commands. The image may be provided through a graphical user interface (GUI) module 118A. Although the GUI module 118A is depicted as a separate module, the instructions performing the GUI functions can be resident or distributed in the operating system 108, the computer program 110, or implemented with special purpose memory and processors.

Some or all of the operations performed by the computer 102 according to the computer program 110 instructions may be implemented in a special purpose processor 104B. In this embodiment, the some or all of the computer program 110 instructions may be implemented via firmware instructions stored in a read only memory (ROM), a programmable read only memory (PROM) or flash memory within the special purpose processor 104B or in memory 106. The special purpose processor 104B may also be hardwired through circuit design to perform some or all of the operations to implement the present invention. Further, the special purpose processor 104B may be a hybrid processor, which includes dedicated circuitry for performing a subset of functions, and other circuits for performing more general functions such as responding to computer program instructions. In one embodiment, the special purpose processor is an application specific integrated circuit (ASIC).

The computer 102 may also implement a compiler 112 which allows an application program 110 written in a programming language such as Common Business-Oriented Language (COBOL), Pascal, C++, FORTRAN, or other language to be translated into processor 104 readable code. After completion, the application or computer program 110 accesses and manipulates data accepted from I/O devices and stored in the memory 106 of the computer 102 using the relationships and logic that was generated using the compiler 112.

The computer 102 also optionally comprises an external communication device such as a modem, satellite link, Ethernet card, or other device for accepting input from and providing output to other computers 102.

In one embodiment, instructions implementing the operating system 108, the computer program 110, and the compiler 112 are tangibly embodied in a computer-readable medium, e.g., data storage device 120, which could include one or more fixed or removable data storage devices, such as a zip drive, floppy disc drive 124, hard drive, CD-ROM drive, tape drive, etc. Further, the operating system 108 and the computer program 110 are comprised of computer program instructions which, when accessed, read and executed by the computer 102, causes the computer 102 to perform the steps necessary to implement and/or use the present invention or to load the program of instructions into a memory, thus creating a special purpose data structure causing the computer to operate as a specially programmed computer executing the method steps described herein. Computer program 110 and/or operating instructions may also be tangibly embodied in memory 106 and/or data communications devices 130, thereby making a computer program product or article of manufacture according to the invention. As such, the terms "article of manufacture," "program storage device" and "computer program product" as used herein are intended to encompass a computer program accessible from any computer readable device or media.

Of course, those skilled in the art will recognize that any combination of the above components, or any number of different components, peripherals, and other devices, may be used with the computer 102.

Figure 2:
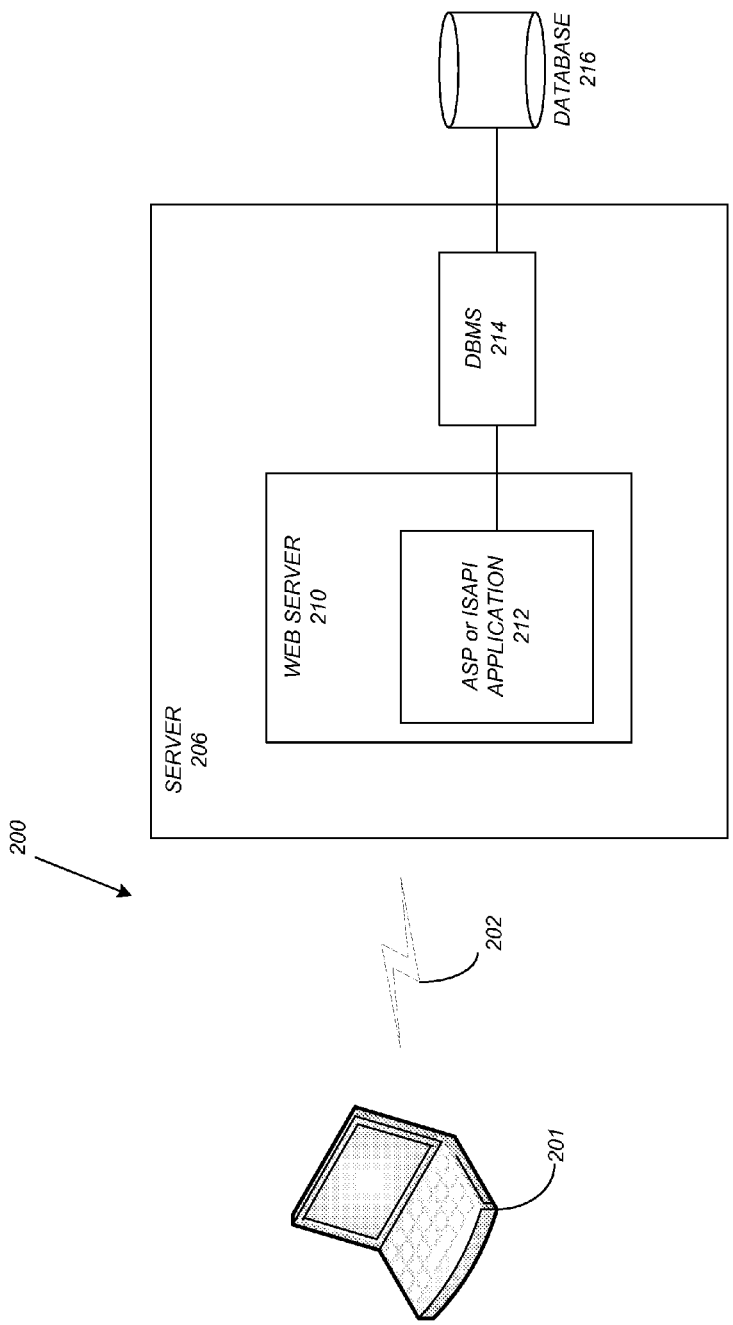
FIG. 2 schematically illustrates a typical distributed computer system using a network to connect client computers to server computers in accordance with one or more embodiments of the invention.

FIG. 2 schematically illustrates a typical distributed computer system 200 using a network 202 to connect client computers 201 to server computers 206. A typical combination of resources may include a network 202 comprising the Internet, LANs (local area networks), WANs (wide area networks), SNA (systems network architecture) networks, or the like, clients 201 that are personal computers or workstations (as set forth in FIG. 1), and servers 206 that are personal computers, workstations, minicomputers, or mainframes (as set forth in FIG. 1).

A network 202 such as the Internet connects clients 201 to server computers 206. Network 202 may utilize ethernet, coaxial cable, wireless communications, radio frequency (RF), etc. to connect and provide the communication between clients 201 and servers 206. Clients 201 may execute a client application or web browser and communicate with server computers 206 executing web servers 210. Such a web browser is typically a program such as MICROSOFT INTERNET EXPLORER™, MOZILLA FIREFOX™, OPERA™, APPLE SAFARI™, etc. Further, the software executing on clients 201 may be downloaded from server computer 206 to client computers 201 and installed as a plug in or ACTIVEX™ control of a web browser. Accordingly, clients 201 may utilize ACTIVEX™ components/component object model (COM) or distributed COM (DCOM) components to provide a user interface on a display of client 201. The web server 210 is typically a program such as MICROSOFT'S INTERNET INFORMATION SERVER™.

Web server 210 may host an Active Server Page (ASP) or Internet Server Application Programming Interface (ISAPI) application 212, which may be executing scripts. The scripts invoke objects that execute business logic (referred to as business objects). The business objects then manipulate data in database 216 through a database management system (DBMS) 214. Alternatively, database 216 may be part of or connected directly to client 102 instead of communicating/obtaining the information from database 216 across network 202. When a developer encapsulates the business functionality into objects, the system may be referred to as a component object model (COM) system. Accordingly, the scripts executing on web server 210 (and/or application 212) invoke COM objects that implement the business logic. Further, server 206 may utilize MICROSOFT'S™ Transaction Server (MTS) to access required data stored in database 216 via an interface such as ADO (Active Data Objects), OLE DB (Object Linking and Embedding DataBase), or ODBC (Open DataBase Connectivity).

Generally, these components 206-218 all comprise logic and/or data that is embodied in/or retrievable from device, medium, signal, or carrier, e.g., a data storage device, a data communications device, a remote computer or device coupled to the computer via a network or via another data communications device, etc. Moreover, this logic and/or data, when read, executed, and/or interpreted, results in the steps necessary to implement and/or use the present invention being performed.

Although the term "user computer", "client computer", and/or "server computer" is referred to herein, it is understood that such computers 201 and 206 may include portable devices such as cell phones, notebook computers, pocket computers, or any other device with suitable processing, communication, and input/output capability.

Of course, those skilled in the art will recognize that any combination of the above components, or any number of different components, peripherals, and other devices, may be used with computers 201 and 206.

Software Embodiments

Embodiments of the invention are implemented as a software application on a client 201 or server computer 206. As described above, such a software application provides a grading method in the form of a "flow grade" solution that evaluates an approximate geometry of a projected slope using an elevation field depth buffer.

A "flow grade" is measured along the gradient line of a surface and involves the evaluation of an approximate geometry of a projected slope using an elevation field depth buffer. Evaluating the approximate geometry in this manner can be used to satisfy maximum allowed slope requirements that are not possible with prior art cross-grade solutions.

Figure 3:
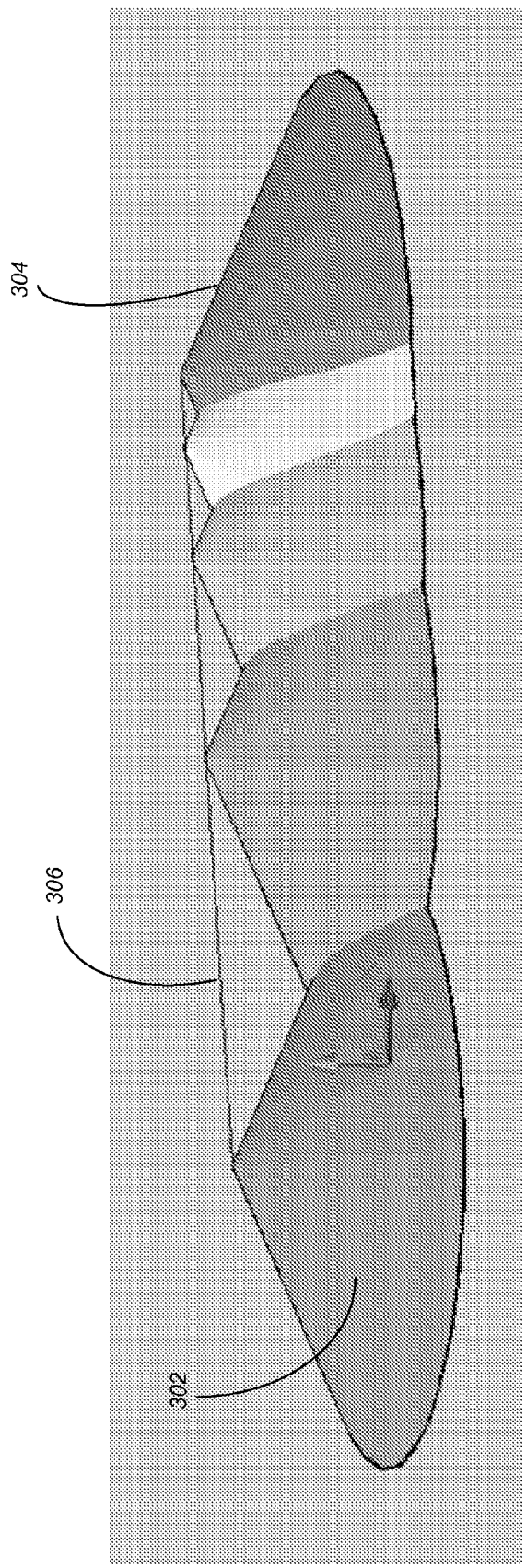
FIG. 3 illustrates a cone that is swept along a curve from which a slope is to be projected in accordance with one or more embodiments of the invention.

As an overview, to compute the elevation field depth buffer, a grid is used to capture the maximum or minimum elevation seen for each vertex as grading shapes are "rendered" to the buffer. The "flow grade" solution from any given point may be considered as a cone with its apex at that point extending at the desired grade to the extents of the grid. FIG. 3 illustrates a cone 302 (having a desired slope 304) that is swept along a curve 306 from which the slope 304 is to be projected. Accumulating the values for many such cones 302 along the footprint provides a good approximation of the flow grade grading solution. Cones 302 may be used in embodiments of the invention (although other shapes may also be used) as a cone 302 represents a flow grade solution for all locations from that point. By adding more cones 302 and keeping only the top part of each cone 302, the approximate/simulated solution approaches the true solution.

More specifically, the elevation field depth buffer is a two-dimensional (2D) array (x-y) with one element for each coordinate. Each element of the buffer captures the maximum elevation (or minimum elevation depending on the direction of the slope) seen for each vertex as grading shapes are "rendered" to the buffer. The grading shapes are generated by sweeping a cone 302 with a desired slope 304 along a curve 306 from which the slope 304 is to be projected. As the cones 302 are rendered, the elevations at grid points are stored in the buffer. When another cone 302 is rendered at the same location, the two elevations are compared and the elevation with the maximum value is saved to the elevation buffer, replacing the old value. If the cone 302 is inverted, the minimum elevation is chosen.

From a given location in the buffer, a cone 302 represents a flow grade solution (path of steepest slope). Thus, in the end, the depth buffer allows the user to correctly reproduce the flow grade solution. The quality of the result can be controlled by changing the granularity of the depth buffer/grid.

Advantages of Flow-Grade Solution

Designing by flow grade may serve three primary purposes:

(1) Slope Requirements: It allows the user to specify maximum allowable grade dictated by soil quality, design standards and ADA guidelines. Further, interior corner cleanups may be handled gracefully;

(2) Aesthetic: By replacing the apex of the swept cone 302 with a tangent sphere, the method allows the user to create concave/convex-shaped slopes 304 that are visually appealing; and (3) Concept to Completion: The user can start with coarse grids to obtain quick approximate answers in the planning stage, and refine the same model by increasing the grid density and adding details, to get accurate estimates of volumes, etc. (at the expense of time to update). Further, the simplicity of data access (e.g., via grid based methods) allow many opportunities for performance optimizations through adaptive refinement, multi-threading, and other forms of optimization.

Logical Flow

Figure 4:
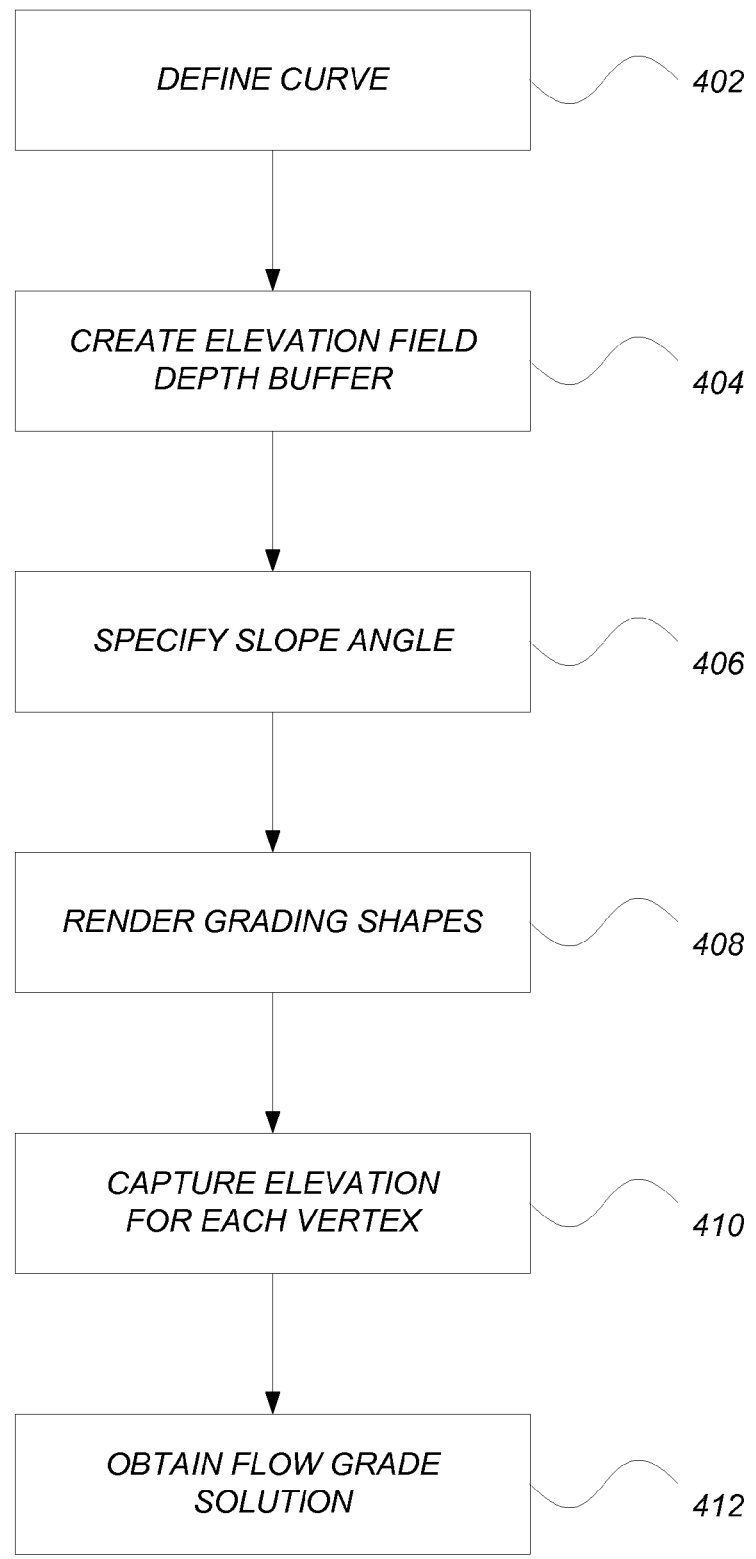
FIG. 4 is a flow chart illustrating the logical flow for creating a flow-grade solution in accordance with one or more embodiments of the invention.

FIG. 4 is a flow chart illustrating the logical flow for creating a flow-grade solution in accordance with one or more embodiments of the invention.

At step 402, a computer-aided design (CAD) building information modeling (BIM) application is used to define a curve from which a slope is to be projected.

At step 404, an elevation field depth buffer is created. The buffer is a two-dimensional (2D) array with one element for each (x-y) coordinate in the 2D array.

At step 406, a slope angle is specified for the slope. This is the angle of steepest descent that the user desires.

At step 408, one or more grading shapes are rendered by sweeping a cone with the slope angle along the curve. The placement of the cone relative to curve is determined by the direction of the slope. For example, the cone is held erect with apex at the top if the slope is to be projected downward. The cone is held inverted with the apex at the bottom if the slope is to be projected upward. The sweeping action involves sweeping the apex of the cone along the curve while the cone is held vertical (upright or inverted).

At step 410, as the one or more grading shapes are rendered for each position of the cone along the curve, a grid is used to capture, into the field depth buffer, an elevation for each vertex of the grid. The elevation is captured into the field depth buffer if the elevation comprises either a maximum or a minimum elevation (depending on the direction of the slope) for the vertex. In other words, when a point of the cone is rendered at a vertex of the grid where an elevation was previously captured, the point elevation of the point of the cone is compared to the previously captured elevation. The greater/lesser (depending on whether a minimum or maximum is utilized) of the point elevation and the previously captured elevation is captured into the field depth buffer. This process is repeated with every subsequent cone rendered at the given grid vertex. In the end, the depth buffer represents an approximate flow grade solution.

At step 412, a flow grade solution (represented by the field depth buffer) is obtained after capturing the elevations from the last cone position. The flow grade solution provides/specifies/includes a path of steepest slope from any given location in the grid. Further, the flow grade solution represents an approximate geometry of the slope projected from the curve. Such a path of steepest slope is determined from the elevation stored for each vertex of the grid in the field depth buffer. Contours (curves of constant elevations) may be drawn by interpolating the grid elevations (stored for each vertex of the grid in the field depth buffer), and the flow path from a given point may be determined by following a path perpendicular to the contours. In designing the flow grade solution, the granularity of the grid may be modified to control the precision of results. For example, the user can start with coarse grids to get quick approximate answers in the planning stage, and refine the same model by increasing the grid density, to get an accurate estimate of volumes, etc. (i.e., the granularity of the grid is modified to change a precision of the results). Such a modification may enable the use of a single grading model from concept of the grading model, used for preliminary analysis, to completion of the grading model, in a form of production drawings.

While generating/rendering grading shapes at step 408, an apex of the swept cone may be replaced with a tangent sphere to create a concave/convex shaped slope (where a result is used for representing organic shapes). This shape can be utilized for representing natural landforms, like swales and berms. In addition, the grade of the cone can be changed as it is swept along the curve to produce a flow grade solution with grades that transition along the curve. This method of generating flow grade solution always produces clean inside corners due to the way the elevations are captured at step 410. The flow grade solution is also scalable to multiple curves. In this regard, overlapping solutions can be created by updating the field depth buffer with elevations from a second curve. No special handling of overlapping geometry is required due to the way field depth buffers can be combined. Thus, a second cone with/having a second slope angle may be swept along a second curve while updating elevations in the field depth buffer (during the sweep operation). Accordingly, clean intersection geometry for overlapping solutions may be produced based on a combining of the field depth buffers. The order of depth buffers can be altered to control the resulting overlapping geometry, according to user's intent.

Further, step 412 may also include the outputting or utilization of the flow grade solution. Such an outputting/utilization of the flow grade solution may include the display (using contours or solid-shaded views in 2D or 3D view), printing, and/or transmission of the flow grade solution. Alternatively, or in addition, the flow grade solution may be used by engineers, designers, etc. to grade terrain, establish drainage patterns and design parking lots, ponds, landfills, aesthetic landforms like organic swales and embankments, etc.

CONCLUSION

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A computer implemented method for creating a flow-grade solution comprising:
   (a) defining, in a computer, in a computer-aided design (CAD) building information modeling (BIM) application, a curve from which a slope is to be projected;
   (b) creating in the computer, a first field depth buffer comprising a two-dimensional (2D) array with one element for each (x-y) coordinate in the 2D array;
   (c) specifying in the computer, a slope angle for the slope;
   (d) rendering in the computer, one or more grading shapes by sweeping a cone with the slope angle along the curve;
   (e) as the one or more grading shapes are rendered, using a grid to capture in the computer, into the first field depth buffer, an elevation for each vertex of the grid; and
   (f) obtaining in the computer, a flow grade solution represented by the first field depth buffer, wherein:
      (i) the flow grade solution represents an approximate geometry of the slope projected from the curve;
      (ii) the flow grade solution comprises a path of steepest slope from any given location in the grid;
      (iii) a steepest slope angle of the steepest slope is equal to the slope angle specified; and
      (iv) the path of steepest slope from any given location in the grid is determined by:
         (1) computing one or more contours by interpolating elevations stored for each vertex of the grid in the first field depth buffer; and
         (2) following a perpendicular path that is perpendicular to the one or more contours from the given location in the grid.

2. The computer-implemented method of claim 1, wherein the swept cone is held erect with the apex at a top of the swept cone if the slope is to be projected in a downward direction.

3. The computer-implemented method of claim 2, wherein as the cone is rendered, if a point of the cone is rendered at a vertex of the grid where the elevation was previously captured:
   comparing a point elevation of the point of the cone to the previously captured elevation; and
   capturing a greater of the point elevation and the previously captured elevation into the first field depth buffer.

4. The computer-implemented method of claim 1, wherein the swept cone is held inverted with the apex at a bottom of the swept cone if the slope is to be projected in an upward direction.

5. The computer-implemented method of claim 4, wherein as the inverted cone is rendered, if a point of the cone is rendered at a vertex of the grid where the elevation was previously captured:
   comparing a point elevation of the point of the cone to the previously captured elevation; and
   capturing a lesser of the point elevation and the previously captured elevation into the first field depth buffer.

6. The computer-implemented method of claim 1, further comprising modifying a granularity of the grid to change a precision of a result.

7. The computer-implemented method of claim 6, wherein the modifying of the granularity of the grid enables a use of a single grading model from concept of the grading model, used for preliminary analysis, to completion of the grading model, in a form of production drawings.

8. The computer-implemented method of claim 1, further comprising replacing the apex of the cone with a tangent sphere to create an either concave or convex shaped slope, wherein a result is used for representing organic shapes.

9. The computer-implemented method of claim 1, further comprising changing the slope of the cone as the cone is swept along the curve to produce transitioning grades in the flow grade solution.

10. The computer-implemented method of claim 1, wherein geometry around one or more inside corners of the curve are produced based on the creating of the flow grade solution.

11. The computer-implemented method of claim 1, further comprising:
    sweeping a second cone with a second slope angle along a second curve; and
    updating a second field depth buffer based on second elevations from the second cone.

12. The computer-implemented method of claim 11, wherein:
    the second field depth buffer for the second curve is created based on the sweeping; and
    intersection geometry for overlapping solutions is produced based on a combining of the first field depth buffer with the second field depth buffer.

13. An apparatus for creating a flow-grade solution in a computer system comprising:
    (a) a computer having a memory;
    (b) a computer-aided design (CAD) building information modeling (BIM) application executing on the computer, wherein the CAD BIM application is configured to:

(i) define a curve from which a slope is to be projected;
(ii) create a first field depth buffer comprising a two-dimensional (2D) array with one element for each (x-y) coordinate in the 2D array;
(iii) specify a slope angle for the slope;
(iv) render one or more grading shapes by sweeping a cone with the slope angle along the curve;
(v) as the one or more grading shapes are rendered, use a grid to capture, into the first field depth buffer, an elevation for each vertex of the grid; and
(vi) obtain a flow grade solution represented by the first field depth buffer, wherein:
  (1) the flow grade solution represents an approximate geometry of the slope projected from the curve;
  (2) the flow grade solution comprises a path of steepest slope from any given location in the grid;
  (3) a steepest slope angle of the steepest slope is equal to the slope angle specified; and
  (4) the path of steepest slope from any given location in the grid is determined by:
    (A) computing one or more contours by interpolating elevations stored for each vertex of the grid in the first field depth buffer; and
    (B) following a perpendicular path that is perpendicular to the one or more contours from the given location in the grid.

14. The apparatus of claim 13, wherein the swept cone is held erect with the apex at a top of the swept cone if the slope is to be projected in a downward direction.

15. The apparatus of claim 14, wherein as the cone is rendered, if a point of the cone is rendered at a vertex of the grid where the elevation was previously captured:
compare a point elevation of the point of the cone to the previously captured elevation; and
capture a greater of the point elevation and the previously captured elevation into the first field depth buffer.

16. The apparatus of claim 13, wherein the swept cone is held inverted with the apex at a bottom of the swept cone if the slope is to be projected in an upward direction.

17. The apparatus of claim 16, wherein as the inverted cone is rendered, if a point of the cone is rendered at a vertex of the grid where the elevation was previously captured:
compare a point elevation of the point of the cone to the previously captured elevation; and
capture a lesser of the point elevation and the previously captured elevation into the first field depth buffer.

18. The apparatus of claim 13, wherein the application is further configured to modify a granularity of the grid to control a precision of results.

19. The apparatus of claim 18, wherein the CAD BIM application modifying the granularity of the grid enables a use of a single grading model from concept of the grading model, used for preliminary analysis, to completion of the grading model, in a form of production drawings.

20. The apparatus of claim 13, wherein the CAD BIM application is further configured to replace the apex of the cone with a tangent sphere to create an either concave or convex shaped slope, wherein a result is used for representing organic shapes.

21. The apparatus of claim 13, further comprising changing the slope of the cone as the cone is swept along the curve to produce transitioning grades in the flow grade solution.

22. The apparatus of claim 13, wherein le-a geometry around one or more inside corners of the curve are produced based on the creating of the flow grade solution.

23. The apparatus of claim 13, wherein the application is further configured to:
sweep a second cone with a second slope angle along a second curve; and
update a second field depth buffer based on second elevations from the second cone.

24. The apparatus of claim 23, wherein:
the second field depth buffer is created based on the sweep of the second cone;
intersection geometry for overlapping solutions is produced based on a combining of the first field depth buffer with the second field depth buffer.

* * * * *

UNITED STATES PATENT AND TRADEMARK OFFICE
CERTIFICATE OF CORRECTION

PATENT NO. : 8,676,546 B2  
APPLICATION NO. : 13/178349  
DATED : March 18, 2014  
INVENTOR(S) : Smita Narayan et al.

Page 1 of 1

It is certified that error appears in the above-identified patent and that said Letters Patent is hereby corrected as shown below:

In the claims,

Column 12

Lines 24-26 delete the text, "22. The apparatus of claim 13, wherein le-a geometry around one or more inside corners of the curve are produced based on the creating of the flow grade solution."

and insert the text, --22. The apparatus of claim 13, wherein geometry around one or more inside corners of the curve are produced based on the creating of the flow grade solution.--

Signed and Sealed this  
Twenty-eighth Day of June, 2016

Michelle K. Lee  
*Director of the United States Patent and Trademark Office*